(12) United States Patent
Schoop et al.

(10) Patent No.: US 9,673,750 B2
(45) Date of Patent: Jun. 6, 2017

(54) MOUNTING STRUCTURES FOR PHOTOVOLTAIC CELLS

(71) Applicant: Global Solar Energy, Inc., Tucson, AZ (US)

(72) Inventors: Urs Schoop, Tucson, AZ (US); Scot Albright, Tucson, AZ (US); Darren Verebelyi, Tucson, AZ (US); Walter Stoss, Tucson, AZ (US); Michael L. Podkin, Tucson, AZ (US)

(73) Assignee: Global Solar Energy, Inc., Tucson, AZ (US)

(*) Notice: Subject to any disclaimer, the term of this patent is extended or adjusted under 35 U.S.C. 154(b) by 0 days.

(21) Appl. No.: 14/155,139

(22) Filed: Jan. 14, 2014

(65) Prior Publication Data

US 2014/0196769 A1    Jul. 17, 2014

Related U.S. Application Data

(60) Provisional application No. 61/752,892, filed on Jan. 15, 2013.

(51) Int. Cl.
*H02S 20/23* (2014.01)
*H01L 31/048* (2014.01)
*F24J 2/52* (2006.01)
*F24J 2/46* (2006.01)

(52) U.S. Cl.
CPC ............ *H02S 20/23* (2014.12); *F24J 2/5205* (2013.01); *F24J 2/5245* (2013.01); *F24J 2/5249* (2013.01); *H01L 31/048* (2013.01); *F24J 2002/4676* (2013.01); *F24J 2002/5224* (2013.01); *Y02B 10/12* (2013.01); *Y02E 10/47* (2013.01); *Y02E 10/50* (2013.01)

(58) Field of Classification Search
CPC ...... F24J 2/5211; F24J 2002/5213–2002/5226
See application file for complete search history.

(56) References Cited

U.S. PATENT DOCUMENTS

| 4,157,639 | A | * | 6/1979 | Saunders ..................... 52/222 |
| 4,371,139 | A | | 2/1983 | Clark |
| 5,228,024 | A | | 7/1993 | Moon et al. |
| 5,228,924 | A | | 7/1993 | Barker et al. |
| 5,232,518 | A | * | 8/1993 | Nath et al. ................ 136/251 |

(Continued)

FOREIGN PATENT DOCUMENTS

| CN | 102347386 A | 2/2012 |
| EP | 1564816 A1 | 8/2005 |

(Continued)

OTHER PUBLICATIONS

Jul. 18, 2014, International Search Report of the International Search Authority from The U.S Receiving Office, in PCT/US2014/011513, which is the international application to this U.S. application.

(Continued)

*Primary Examiner* — Eric R Smith
(74) *Attorney, Agent, or Firm* — Kolisch Hartwell, P.C.

(57) ABSTRACT

Mounting systems for PV modules and assemblies of modules, including apparatus and methods of use. The disclosed systems generally involve mounting a flexible photovoltaic module in a slight arch, bending it with a large radius around one axis of the module.

7 Claims, 8 Drawing Sheets

(56) References Cited

U.S. PATENT DOCUMENTS

| | | | |
|---|---|---|---|
| 5,505,788 | A | 4/1996 | Dinwoodie |
| 5,746,839 | A | 5/1998 | Dinwoodie |
| 5,776,262 | A * | 7/1998 | Melchior ............... H01L 31/048 |
| | | | 136/251 |
| 5,787,653 | A * | 8/1998 | Sakai et al. .................. 52/173.3 |
| 6,495,750 | B1 | 12/2002 | Dinwoodie |
| 6,501,013 | B1 | 12/2002 | Dinwoodie |
| 6,534,703 | B2 | 3/2003 | Dinwoodie |
| 6,570,084 | B2 | 5/2003 | Dinwoodie |
| 6,690,041 | B2 | 2/2004 | Armstrong et al. |
| 6,809,251 | B2 | 10/2004 | Dinwoodie |
| 6,809,253 | B2 | 10/2004 | Dinwoodie |
| RE38,988 | E | 2/2006 | Dinwoodie |
| 7,194,197 | B1 | 3/2007 | Wendt et al. |
| 7,814,899 | B1 | 10/2010 | Port |
| 8,062,922 | B2 | 11/2011 | Britt et al. |
| 8,198,123 | B2 | 6/2012 | Britt et al. |
| 8,202,368 | B2 | 6/2012 | Britt et al. |
| 8,418,983 | B2 | 4/2013 | Hartelius et al. |
| 8,505,224 | B2 * | 8/2013 | Huang ................... H02S 30/10 |
| | | | 126/704 |
| 2004/0221524 | A1 | 11/2004 | Poddany et al. |
| 2009/0088162 | A1 | 4/2009 | Zhao et al. |
| 2010/0096073 | A1 * | 4/2010 | Adriani ............. B32B 17/10018 |
| | | | 156/160 |
| 2010/0263724 | A1 * | 10/2010 | Tazawa ................. F24J 2/5211 |
| | | | 136/259 |
| 2011/0036539 | A1 * | 2/2011 | Balduini et al. ................ 165/47 |
| 2011/0073733 | A1 | 3/2011 | Hartelius et al. |
| 2011/0303262 | A1 * | 12/2011 | Wolter ......................... 136/251 |
| 2012/0000502 | A1 | 1/2012 | Wiedeman et al. |
| 2012/0000510 | A1 | 1/2012 | Wiedeman et al. |
| 2012/0006398 | A1 | 1/2012 | Nguyen et al. |
| 2012/0090176 | A1 | 4/2012 | Stancel et al. |
| 2013/0220395 | A1 * | 8/2013 | Babineau et al. ............ 136/244 |

FOREIGN PATENT DOCUMENTS

| | | | |
|---|---|---|---|
| EP | 2279381 A2 | 2/2011 | |
| WO | WO 2010054274 A2 * | 5/2010 | ............. H02S 20/00 |

OTHER PUBLICATIONS

Jul. 18, 2014, Written Opinion of the International Search Authority from The U.S Receiving Office, in PCT/US2014/011513, which is the international application to this U.S. application.

Jul. 30, 2015, International Preliminary Report on Patentability from The International Bureau of WIPO, in PCT/US2014/011513, which is an international application that shares the same priority as this U.S. application.

Aug. 6, 2016, Office action from the State Intellectual Property Office of the People's Republic of China, in Chinese Patent Application No. 201480015674.7, which is a foreign application that shares the same priority as this U.S. application.

Jul. 29, 2016, Office action from the State Intellectual Property Office of the People's Republic of China, in Chinese Patent Application No. 201480015674.7, which is a foreign application that shares the same priority as this U.S. application.

* cited by examiner

MOUNTING STRUCTURES FOR PHOTOVOLTAIC CELLS

CROSS-REFERENCE TO RELATED APPLICATIONS

The present application claims priority to U.S. Provisional Patent Application No. 61/752,892, filed Jan. 15, 2013, which is hereby incorporated by reference into the present disclosure for all purposes. This application also incorporates the following United States patents and patent applications: U.S. Pat. Nos. 6,690,041, 7,194,197, 2012/0006398, 2012/0000510, 2012/0000502, U.S. Pat. Nos. 8,202,368, 8,198,123, 2009/0088162, U.S. Pat. Nos. 8,062,922, 61/284,956, 61/284,958, 61/356,194. The disclosures of the patent and patent applications referenced herein are incorporated by reference in their entirety for all purposes.

INTRODUCTION

Solar, or photovoltaic (PV), panels have been used for decades to create usable electrical power by harnessing the sun's energy. PV panels are usually mounted in suitable locations for maximum exposure to the sun. Frequently, these locations include building rooftops, both industrial and residential. Accordingly, various methods and devices have been developed for mounting PV panels on the roofs of buildings.

The terms "solar panels," "photovoltaic panels," and "PV panels," as used in this disclosure, include all types of photovoltaic material suitable for mounting in a generally non-planar orientation. For example, solar panels suitable for use with the present teachings include those constructed from thin-film flexible PV material, such as material incorporating copper indium gallium diselenide (CIGS) type semiconductors.

Solar panels are typically sold separately from the racks or mounting structures used to install them on a building rooftop. This situation often requires a user to acquire custom-built rack mounting solutions with accompanying high installation costs. One-size-fits-all rack mounting systems are available. However, those systems tend to be complex, heavy, require multiple roof penetrations, and employ metal construction requiring extensive grounding. Furthermore, existing mounting systems are generally configured only to mount solar panels in planar orientations, either parallel to a rooftop or at a predetermined angle relative to a rooftop. Exemplary existing photovoltaic mounting systems are described, for example, in U.S. Pat. Nos. 4,371,139, 5,228,924, 5,505,788, 5,746,839 (reissued as RE038988), U.S. Pat. Nos. 6,495,750, 6,501,013, 6,534,703, 6,570,084, 6,809,251, 6,809,253, and 7,814,899, each of which is hereby incorporated by reference into the present disclosure for all purposes.

Current solutions for mounting flexible (as opposed to rigid) photovoltaic modules typically involve at least the following special considerations. First, mounting a flexible solar module is currently done by adhering the flexible modules each with its backside adjacent with the roofing membrane. Many roofs have a topography that is not flat or an unknown condition of the flat roofing surface posing a challenge for mounting methods based on adhesives. Mounting the lightweight modules spanning a roofing topography such as corrugated metal rooftops requires adding a stiffener to the structure to avoid sagging in between the mounting points, water collection in the sagged areas and excessive movement in wind. In addition, mounting a flat lightweight module structure on a flat roof without sufficient slope bears the danger that the module will experience standing water on it or around it, which can adversely affect module reliability. Furthermore, mounting a module directly to a rooftop often increases its operational temperature, because the module often assumes the temperature of the roof itself. Conventional mounting techniques for glass modules provide air circulation under the module and hence cooler temperatures for the module operation, but this may not be possible for flexible, thin film modules. Finally, mounting by adhesives onto a roofing surface is generally intended to be permanent, so that the module cannot easily be removed in case the roof needs to be repaired or replaced.

As a result of the considerations listed above, among others, there is a need for improved methods and mounting structures for mounting flexible PV modules onto building rooftops or other surfaces.

SUMMARY

The present teachings disclose mounting systems for PV modules and assemblies of modules, including apparatus and methods of use. The disclosed systems generally involve mounting a flexible photovoltaic module in a slight arch, bending it with a large radius around one axis of the module. An additional advantage of the present invention is that the disclosed mounting structures can be standardized for many different roofing surfaces, and can streamline the installation process for reduced balance-of-service (BOS) cost of a PV installation.

DETAILED DESCRIPTION

The present teachings involve mounting a flexible photovoltaic module in a slight arch, bending it with a large radius around one axis (typically, but not necessarily, the long axis) of the module. This pre-bending of the module stabilizes it for bends and movement along the chosen axis of the module. The teachings of the present disclosure utilize the fact that a flexible sheet cannot bend along two axes at the same time. Specifically, the bend can be negative or positive (curving the edges up or down in relation to the mounting surface). The shape may be symmetric, like an arch, or it may be asymmetric like a section of an ellipsoid, teardrop or airplane wing to avoid standing water and optimize sun exposure.

To accomplish mounting flexible photovoltaic modules in curved configurations, the present teachings describe various mounting structures that can be attached either directly to a rooftop or other underlying surface, or to an intermediate structure, such as mounting rails, attached to the underlying surface requiring a minimum number of roof penetrations. In case of a metal seam roof as an example, the mounting structure could be mounted across the metal seams perpendicular to the slope, or within the metal pans and seams along the roof slope. A mounting structure according to aspects of the present teachings also could also be used to mount a photovoltaic module on a ground mount structure or onto other structures, vehicles or stakes anchored into the ground. To install one or more modules simultaneously, one or more of these mounting structures could be connected before attaching them to a structure as mentioned above.

According to the present teachings, a flexible photovoltaic module can be fastened onto a mounting structure using clamping devices, adhesives, hook and loop fasteners or combinations thereof, among others. One way to mount a module could be to laminate the module to a piece of flexible sheet or foil (for example, made from reinforced or non-reinforced polymers or metal foil or combinations thereof). This could be an additional layer adhered to the module by lamination (with or without using an additional adhesive such as EVA, DNP or silicone). This flexible mounting sheet may not be continuous, but instead could only be adhered to the modules in areas needed for mounting to a mounting structure. For example, it may be two strips overlapping each of the long edges of the module.

Alternatively, a flexible backing sheet could be an integral functional part of the photovoltaic module construction, which is extended outside of the water seal of the module (such as the module's backsheet). In any case, the extended area of flexible sheet can be used to attach the module onto the mounting structures described in the present teachings by mechanical clamping, screwing or using adhesives or heat welding. In an alternative mounting method, this flexible sheet may be used to mount the module onto the roofing structure or membrane or a frame, which is attached to the roof or to a ground mount.

The following sections describe additional aspects, advantages and examples of mounting structures for photovoltaic modules according to the present teachings.

I. Benefits of Mounting Photovoltaic Modules with Curvature

Mounting modules with positive curvature (center higher than edges) may result in the following benefits, among others:

Ventilation of center of module with free airflow along length.

Reduced water load in rain, as the water collected on the module drains to the module edges.

Water draining to the module edge will keep the module center clean from dust and debris, resulting in potentially improved radiation absorption.

On the other hand, mounting modules with negative curvature (center lower than edges) may result in the following benefits, among others:

Wind lift will push the module edges deeper into the mounting rails, locking the module in place.

Water is drained to the center of the module, away from the edges. Standing water on the edges is deemed a higher reliability risk than in the center.

If the module edge is lifted up and secured in a mechanical c-profile, the center can be supported by the roof surface or secured using adhesive.

Due to the center support, this method might be more applicable for wider modules or modules that need to be walked upon.

If the module center is supported by a roof surface, this might provide better support for snow loads.

Less wind lift if module edges are sealed (for example, for application on vehicles).

Sunny side in could have additional light concentrating features, if the module area is light colored and reflective.

Between modules, additional reflectors could bring more light into the active light gathering area.

Accordingly, particular situations may favor one type of curvature or the other, and the present teachings contemplate either type. The features and advantages described above are further illustrated by the following examples.

II. Mounting Structures Providing Curvature Across the Width of the Module

In this example, mounting hardware is used at distinct intervals along the long side of a flexible photovoltaic module to give the module an arched shape across its width; see FIGS. 1-8.

Figure 1:
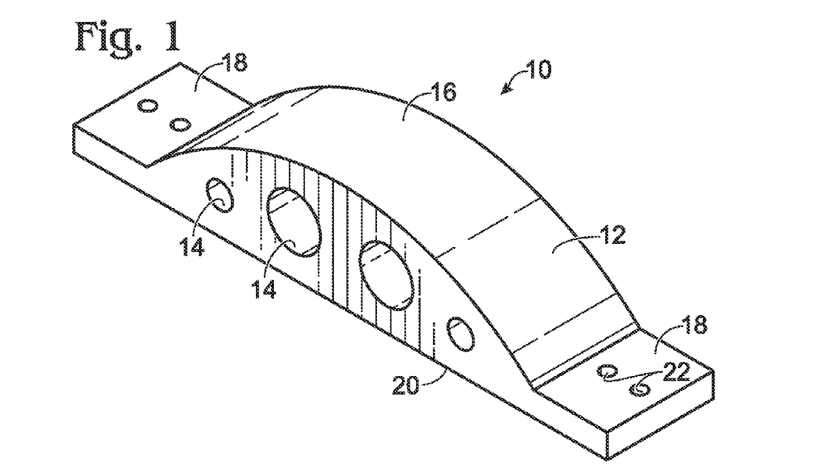
FIG. 1 is an isometric view of a mounting structure for a flexible photovoltaic module, according to aspects of the present teachings.

FIG. 1 is an isometric view of a mounting structure, generally indicated at 10, for a flexible photovoltaic module, according to aspects of the present teachings. Mounting structure 10 is configured to span the width of a photovoltaic module, with the module disposed in contact with the top surface 12 of the mounting structure. Accordingly, top surface 12 determines the shape of the curvature of the mounted module.

Mounting structure 10 may be constructed from various suitable materials, for example, but not restricted to, aluminum sheet metal, fiber inforced composites or molded plastic. These molded pieces are made such that they increase the distance of the PV module to the roof in the center of the module, yet the module edges still lay flat on the roofing membrane. The resulting space under the module not only provides the module with a curved shape, but also allows air circulation under the module for cooling, as well as the benefit of removing the module from standing water.

In addition to ventilation, the space under the module created by the module curvature also provides a conduit for electrical wiring from the module. Furthermore, the mounting structure can be manufactured such that it allows air ventilation and/or wiring passage, but does not allow birds or small animals to access the space under the module for nesting. For example, mounting structure 10 may include a plurality of apertures 14 which are sufficiently large to allow the passage of wires and adequate air flow into the space under the module, but sufficiently small to prevent animals from passing into the space.

Mounting structure 10 includes a curved center section 16 and edge portions 18 on either side of the center section. The edge portions are depicted in FIG. 1 as substantially planar and parallel to a planar bottom surface 20 of the mounting structure. Edge portions 18 each include fastener apertures 22, which are configured to receive fasteners that can be used to fix the mounting structure to a rooftop, and in some cases to fix a PV module to the mounting structure. As described in more detail below, fixing a PV module to the mounting structure can be accomplished in various ways.

Figure 2:
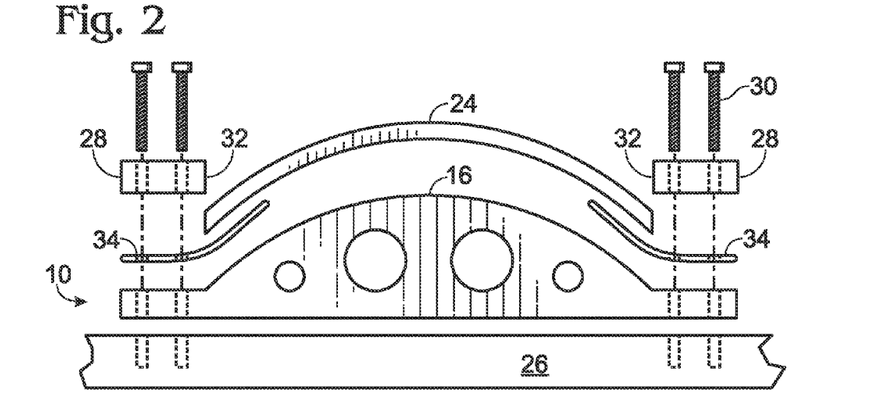
FIG. 2 is an exploded elevational view of a flexible photovoltaic module mounted to the mounting structure of FIG. 1.

FIG. 2 is an exploded sectional view of a flexible photovoltaic module 24 mounted to mounting structure 10 of FIG. 1, which in turn is mounted to a planar rooftop 26. FIG. 2 also depicts mounting anchors 28, which are configured to fix mounting structure 10 to rooftop 26 with mounting screws 30 (or similar hardware), and to hold module 24 in place against mounting structure 10. As indicated in FIG. 2, in some cases module 24 may have a width that closely matches the arc length of curved center section 16 of mounting structure 10. In this case, the edges of module 24 may not be overlapped by mounting anchors 28 or penetrated by mounting screws 30, but rather may be held in place by friction between the module and proximal edge portions 32 of the mounting anchors.

Alternatively, module 24 may have a width which is slightly greater than the arc length of center section 16 of the mounting structure. In this case, the edges of the module will extend at least partially along edge portions 18 of the mounting structure, and may be overlapped by mounting anchors 28 and possibly also penetrated by mounting screws 30. In comparison with the arrangement depicted in FIG. 2, this overlapping arrangement has the advantage of more secure fixation of the module to the mounting structure and the rooftop. In addition, disposing the module edges under the mounting anchors will generally cause the edge portions of the module to acquire a planar shape. This planar shape will be maintained along the length of the module, even between mounting structures, so that the module edges will rest flat against the underlying roof, or in close proximity to the roof, which can help to reduce standing water under the module and wind lift. On the other hand, the overlapping arrangement makes the module more difficult to remove (e.g., for service or replacement), and penetration of the module by fixation hardware such as screws 30 can give rise to water penetration at the fixation points and thus lead to potential reliability problems.

In either of the cases described above, a layer of laminate material 34 may be disposed around the positions where the edge portions of the PV module meet mounting structure 10 and/or mounting anchors 28, to provide more secure attachment of the module to the mounting structure. Layer 34 may, for example, be constructed from a well known material such as ethylene vinyl acetate (EVA), silicone, thermoplastic polyolefin (TPO), or the like. Laminate layer 34 may be used alternatively or in addition to mounting screws 30. Other alternatives for fixing the mounting structure to the rooftop include, for example, other types of mechanical fasteners, proprietary adhesives, hook and loop fasteners or combinations thereof.

Figure 3:
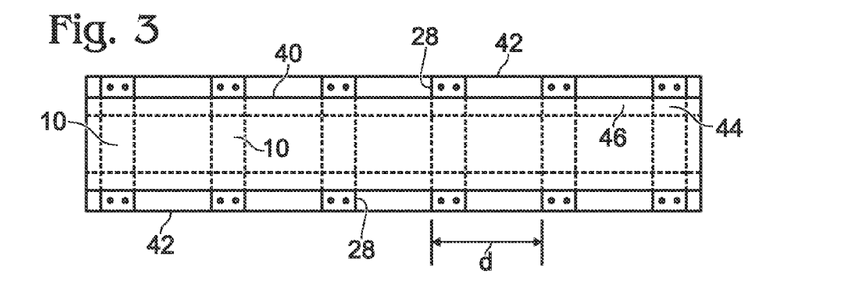
FIG. 3 is a top view of a flexible photovoltaic module mounted to a plurality of mounting structures such as the mounting structure of FIG. 1.

FIG. 3 is a top view of a flexible photovoltaic module 40 mounted to a plurality of mounting structures 10, which are described above in relation to FIGS. 1-2. As depicted in FIG. 3, a plurality of mounting structures 10 may be disposed at a predetermined separation distance d from each other, to support module 40 at a plurality of discrete positions along its length. Mounting anchors 28 are positioned at the edge portions of each mounting structure, to hold module 40 in place. In addition, FIG. 3 shows a pair of underlying rails 42 disposed under mounting structures 10. Rails 42 may be used, for example, when a rooftop does not itself offer sufficient mounting points for the mounting structures, or to provide a surface with a desired degree of planarity and uniformity for attaching the mounting structures.

In some cases, rails 42 may be specially configured to receive mounting structures 10, for instance by having recessed portions 44 into which edge portions 18 of the mounting structures are received, along with complementary raised portions 46 configured to match the height of edge portions 18. Thus, when mounting structures 10 are attached to rails 42, the lateral edge portions of the combined structure form a substantially planar surface that meets the edge portions of module 40. This can reduce wind lift, water ingress and animal entry into the interior spaces under the curved module.

Figure 4:
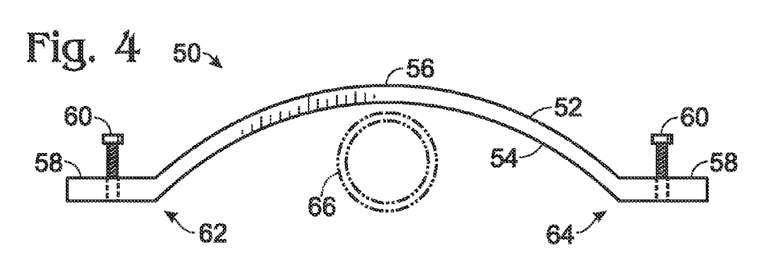
FIG. 4 is a schematic elevational view of a flexible photovoltaic module mounted to a rooftop in an arched configuration using a clamping mechanism, according to aspects of the present teachings.

FIG. 4 is a schematic sectional view of another curved photovoltaic module mounting structure, generally indicated at 50, according to aspects of the present teachings. Mounting structure 50 includes a top surface 52, a bottom surface 54, a central curved portion 56, and substantially planar edge portions 58. Edge portions 58 are configured to be attached to a mounting surface, such as a rooftop or mounting rails, with fasteners such as mounting screws 60. In this example, a photovoltaic module (not shown) can be positioned along bottom surface 54 of mounting structure 50, with the module curvature matching the curvature of the bottom surface.

In some cases, if the module width matches the arc length of bottom surface 54, the module edges will be substantially aligned with junctions 62, 64 where curved portion 56 meets edge portions 58 of the mounting structure. In other cases, if the module width is greater than the arc length of bottom surface 54, edge portions of the module may extend below planar edge portions 58 of the mounting structure. In that case, the edge portions of the module will be clamped in place between the mounting structure and the underlying mounting surface. Irrespective of whether the edges of the module extend below planar edge portions 58, a center support 66 may be provided to ensure that the module maintains its curvature when positioned under bottom surface 54 of the mounting structure. Center supports 66 may be pre-installed or pre-positioned on an underlying surface before installing modules or mounting structures.

Figure 5:
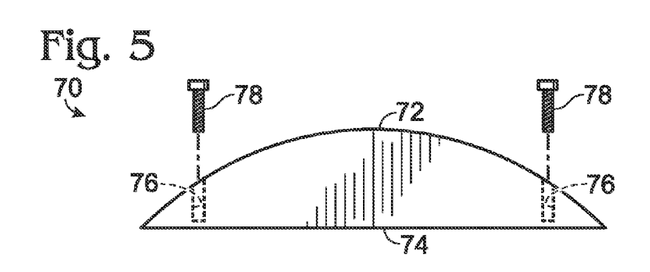
FIG. 5 is a schematic elevational view of a flexible photovoltaic module mounted to a rooftop in an arched configuration using an arched support structure, according to aspects of the present teachings.

FIG. 5 is a schematic sectional view of yet another arched photovoltaic module mounting structure, generally indicated at 70, according to aspects of the present teachings. Mounting structure 70 includes a curved top surface 72 to which a photovoltaic module may be attached, and a substantially planar bottom surface 74 configured to be attached to an underlying mounting surface such as a rooftop or mounting rails.

Mounting structure 70 is generally solid, except that apertures 76 are formed in the mounting structure and configured to receive fasteners such as screws 78 for attaching the mounting structure to an underlying surface. In this example, a photovoltaic module may be attached to top surface 72, for example, by adhesive or hook-and-loop material. When mounted upon mounting structure 70, a photovoltaic module may cover apertures 76.

Figure 6:
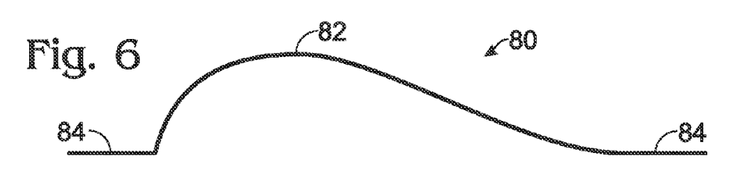
FIG. 6 is a schematic elevational view depicting a flexible photovoltaic module mounted to rooftop in an arched configuration, according to aspects of the present teachings.
Figure 7:
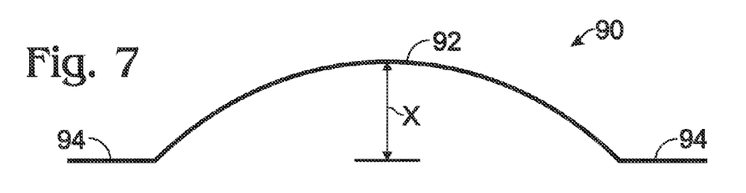
FIG. 7 is a schematic elevational view depicting a flexible photovoltaic module mounted to rooftop in another arched configuration, according to aspects of the present teachings.
Figure 8:
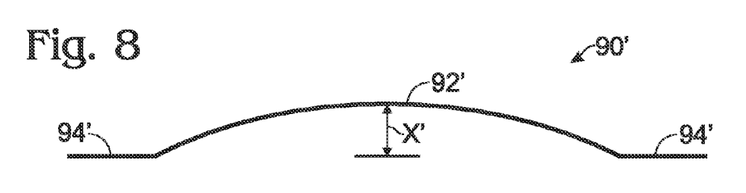
FIG. 8 is a schematic elevational view depicting a flexible photovoltaic module mounted to rooftop in still another arched configuration, according to aspects of the present teachings.

FIGS. 6-8 are schematic sectional views depicting different arched configurations of photovoltaic module mounting structures, according to aspects of the present teachings. The various configurations shown in FIGS. 6-8 and described in this example can generally be applied to any of the mounting structures described in the present disclosure.

More specifically, FIG. 6 depicts an asymmetric arched shape, generally indicated at 80, for a photovoltaic mounting structure. A mounting structure having arched shape 80 will have an asymmetric central curved portion 82 configured to support and shape a flexible photovoltaic module, and substantially planar edge portions 84 configured to be attached to an underlying surface. Asymmetric central curved portion 82 may, for example, be shaped like an ellipsoid, teardrop or airplane wing. Such an asymmetric profile may help to avoid the accumulation of standing water on an overlying module, and also may optimize sun exposure of the module, for instance by effectively angling a greater fraction of the module in a particular direction based on the geographic location of the solar installation.

FIG. 7 depicts a symmetric arched shape, generally indicated at 90, for a photovoltaic mounting structure. A mounting structure having arched shape 90 will have a symmetric central curved portion 92 configured to support and shape a flexible photovoltaic module, and substantially planar edge portions 94 configured to be attached to an underlying surface. The degree of curvature of central curved portion 92 is characterized by the distance x between the plane defined by edge portions 94 and the center of curved portion 92.

FIG. 8 is similar to FIG. 7, and primed reference numbers have been used to indicate parallel components. The only difference is that in FIG. 8, the distance x' that characterizes the degree of curvature of curved portion 92' is substantially smaller than the corresponding distance x in FIG. 7. Accordingly, arched shape 90' in FIG. 8 is significantly less curved than arched shape 90 in FIG. 7. Collectively, FIGS. 6-8 illustrate that the present teachings contemplate symmetric and asymmetric photovoltaic module mounting structures having any desired degree of curvature.

III. Mounting Rails Provided Along the Length of the Module

The mounting structures described previously and shown in FIGS. 1-8 are all configured to contact a photovoltaic module across substantially the entire width of the module. Alternatively, other forms of mounting structures according to the present teachings would support the module only at the edges, leaving the center free standing; see FIGS. 9-32.

Mounting structures according to the teachings of this section can be realized without any use of mounting members spanning across the module width. One embodiment could include rails covering the entire length of the module. Each module would be fastened by two rails mounted in a distance closer to each other than the width of the module, thus forcing the center of the module to curve either up or down. The design of the rail can be different to predetermine the bending direction of the module, e.g. to guide the module to lift the center up from the underlying surface. Alternatively the rails could be wedge shaped, lifting the edges up and pushing the center down along a guided slope/radius.

If the module edges are higher compared to the center, the center could in addition be in contact with the roofing membrane or even be adhered to the roofing membrane using adhesive. In an installation of multiple modules, one rail between two mounted modules could hold both module edges of the neighboring modules, such that on average only one rail is used per module. The rails could be part of a picture frame covering all four sides of a module array, or could provide a system that can be quickly assembled for a rapid deployment of a temporary installation (connect with cross members to form a lattice, or have preassembled diagonal members to be extractable).

FIGS. 9-16 are schematic partial elevational views depicting flexible photovoltaic modules mounted to mounting structures that include various clamping mechanisms, according to aspects of the present teachings. The designs described in this section incorporate two main ideas. First, the mounting systems are generally configured to allow movement of the module edge as to accommodate for thermal expansion during the day and seasonal cycles without excerting forces onto the fragile module edge as it can get quite soft when hot. Some design concepts in this section clamp the module edges and therefore fix it; other designs are open and let the module edge slide freely. In some embodiments one side of the rail may have one design where the other side might feature a different design. This would result in an array where a module might be fixed on one one side and allow to expand and move on the opposite side. Different embodiments also allow for water to not be trapped by the design of the edge holder which easily could happen due to capillary forces. Features in the design can either drain water away from the cavity or allow for aircirculation to dry the area more efficiently in case water gets trapped.

Although FIGS. 9-16 depict mounting structures configured to receive only one edge of a photovoltaic module, in each case, the present teachings contemplate using two of the depicted mounting structures disposed in proximity to each other, one configured to receive each edge of a photovoltaic module. In some cases, unidirectional right-handed and left-handed mounting structures may be provided, whereas in other cases, each mounting structure may be bidirectional, i.e. symmetric and configured to receive the edges of two different modules.

Figure 9:
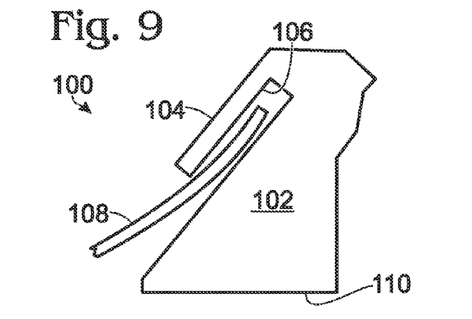
FIG. 9 is a schematic partial elevational view depicting a flexible photovoltaic module mounted to a rooftop with a mounting structure, according to aspects of the present teachings.

More specifically, FIG. 9 depicts a partial sectional view of a mounting structure, generally indicated at 100, which includes a main body portion 102 and a long overlap portion 104 that partially overlaps the body portion, i.e. where the body portion and the overlap portion collectively form a groove 106 between the body portion and the overlap portion, the groove configured to receive an edge of a flexible photovoltaic module 108. Main body portion 102 includes a substantially planar bottom surface 110, which is configured to be attached to a planar rooftop or to some other underlying structure such as mounting rails, and a side support surface 112, which is configured to support a lateral part of module 108 and to guide the edge of the module into groove 106.

Side surface 112 may be arcuate, to match or substantially match the intended curvature of module 108, or the side surface may be linear. In either case, the module will be curved as a result of being disposed between two mounting structures separated by a distance less than the module width. More specifically, in the example of FIG. 9, as a result of the length of overlap portion 104, groove 106 holds a relatively long portion of module 108 substantially straight, so that only a desired central portion of the module will be curved as the module traverses the region between mounting structure 100 and another complementary mounting structure (not shown) configured to receive the opposite edge of module 108.

Figure 10:
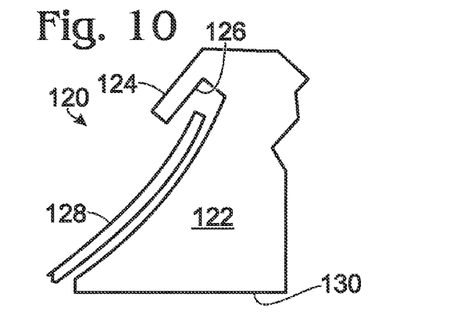
FIG. 10 is a schematic partial elevational view depicting a flexible photovoltaic module mounted to a rooftop with another mounting structure, according to aspects of the present teachings.

FIG. 10 depicts a partial sectional view of another mounting structure, generally indicated at 120, which includes a main body portion 122 and a relatively short overlap portion 124, where the body portion and the overlap portion again collectively form a groove 126 configured to receive an edge portion of a flexible photovoltaic module 128. Main body portion 122 also includes a substantially planar bottom surface 130, which is configured to be attached to a planar rooftop or to some other underlying structure such as mounting rails. Due to short overlap portion 124, groove 126 holds a relatively small portion of module 128 substantially straight, so that substantially the entire width of the module will be curved as the module passes between mounting structure 120 and another complementary mounting structure configured to receive the opposite edge of photovoltaic module 128.

Figure 11:
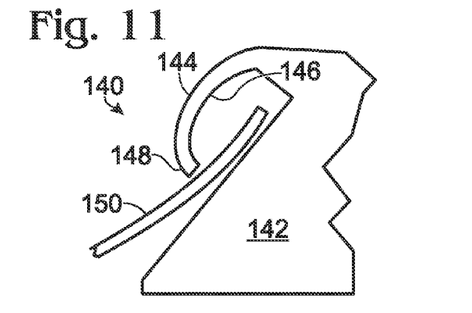
FIG. 11 is a schematic partial elevational view depicting a flexible photovoltaic module mounted to a rooftop with another mounting structure, according to aspects of the present teachings.

FIG. 11 depicts a partial sectional view of yet another mounting structure, generally indicated at 140, which includes a main body portion 142 and an overlap portion 144 that defines a gap 146 that narrows toward its proximal end, i.e. toward the distal end 148 of the overlap portion. Gap 146 is configured to receive an edge portion of a flexible photovoltaic module 150. Again, main body portion 142 will generally include a surface configured to be attached to a planar rooftop or to some other underlying structure such as mounting rails. Narrowing gap 146 can have any desired length, and essentially forces a corresponding portion of module 150 into a known position between distal end 148 of the overlap portion and main body portion 142. The remainder of the photovoltaic module will then assume the degree of curvature necessary for the module to span the distance to another corresponding mounting structure (not shown) configured to receive the opposite edge of the module.

Figure 12:
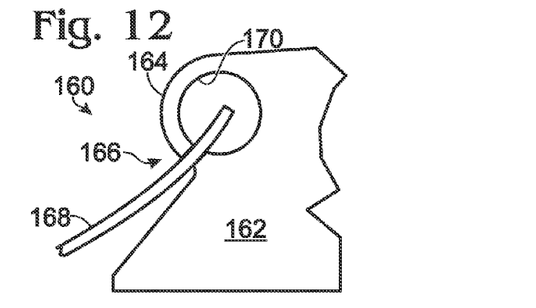
FIG. 12 is a schematic partial elevational view depicting a flexible photovoltaic module mounted to a rooftop with another mounting structure, according to aspects of the present teachings.

FIG. 12 depicts a partial sectional view of still another mounting structure, generally indicated at 160, which includes a main body portion 162 and a photovoltaic module overlap portion 164 that defines a narrow proximal region or "pinch point" 166 configured to allow an edge portion of a photovoltaic module 168 to pass through, and a wider distal region 170 within which a portion of the mounted photovoltaic module will be disposed. As in the previous examples, main body portion 162 will generally also include a surface configured to be attached to a planar rooftop or to some other underlying structure such as mounting rails. Pinch point 166 fixes the position of module 168 as it passes through the pinch point. The remainder of the photovoltaic module will then assume the degree of curvature necessary for the module to span the distance to another corresponding mounting structure (not shown) configured to receive the opposite edge of the module.

Figure 13:
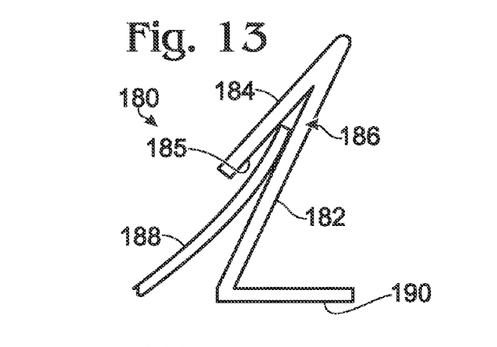
FIG. 13 is a schematic partial elevational view depicting a flexible photovoltaic module mounted to a rooftop with another mounting structure, according to aspects of the present teachings.

FIG. 13 depicts a partial sectional view of still another mounting structure, generally indicated at 180, which includes a main body portion 182 and a module overlap portion 184 that defines a narrowing gap 185 between the overlap portion and the body portion, terminating in a distal pinch point 186 configured to receive and retain an edge portion of a photovoltaic module 188. Again, main body portion 182 will generally also include a surface 190 configured to be attached to a planar rooftop or to some other underlying structure. Pinch point 186 fixes the position of the terminal edge of module 188 as it reaches the pinch point. The photovoltaic module will then assume the degree of curvature necessary for the module to span the distance to another corresponding mounting structure (not shown), such as one configured to receive the opposite terminal edge of the module at another pinch point.

Figure 14:
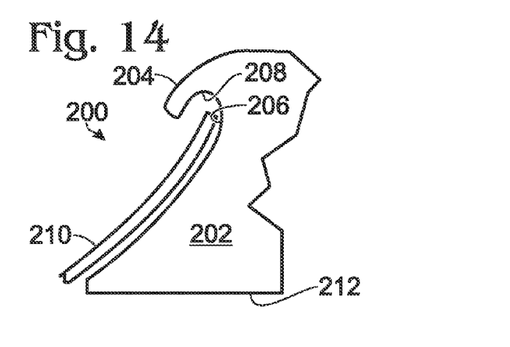
FIG. 14 is a schematic partial elevational view depicting a flexible photovoltaic module mounted to a rooftop with another mounting structure, according to aspects of the present teachings.

FIG. 14 depicts a partial sectional view of yet another mounting structure, generally indicated at 200, which includes a main body portion 202 and a module retention portion 204 defined by a decreasing radius of curvature along an edge portion 206 of the main body, culminating in a distal end 208 to form a partial cul-de-sac to receive and retain an edge portion of a photovoltaic module 210. This general arrangement can be used to retain the edge of the module without exposing the edge to any sharp edges or pinch points, while reducing the risk of bending or deformation of the overlap portion of the mounting structure. As in the other examples depicted in FIGS. 9-16, mounting structure 200 would also include a mounting surface 212 configured to securely attach the mounting structure to a rooftop, mounting rails or the like, and two mirror-image or bidirectional mounting structures (see next example) would be used to secure opposite edges of the photovoltaic module.

Figure 15:
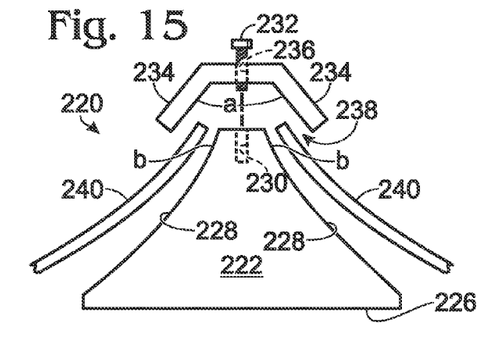
FIG. 15 is a schematic partial elevational view depicting a flexible photovoltaic module mounted to another rooftop with a mounting structure, according to aspects of the present teachings.

FIG. 15 depicts a partial sectional view of still another mounting structure, generally indicated at 220. Mounting structure 220 is a bidirectional structure having a body portion 222 and an attachable module retention portion 224, each of which are substantially symmetric around a central axis. In other words, mounting structure 220 is a two-part structure, with the module retention portion selectively attachable and removable from the body portion. Body portion 222 has a bottom mounting surface 226 configured to be attached to a rooftop or other underlying surface (e.g., using fasteners or some other suitable mechanism), and a pair of symmetric arcuate side surfaces 228, each characterized by an upper portion having a slope b relative to the bottom mounting surface and thus typically relative to the underlying surface. Body portion 222 also includes an aperture 230 for receiving a fastener 232, so that module retention portion 224 can be securely attached to body portion 222.

Module retention portion 224 has an approximately v-shaped cross section, where each half of the v-shape defines an angled surface 234 characterized by a slope a relative to the bottom mounting surface and thus typically relative to the underlying surface. Module retention portion 224 also includes an aperture 236 for receiving fastener 232, so that the fastener can be inserted and secured within apertures 236 and 230 to join the module retention portion and the body portion together. Slope a that characterizes angled surfaces 234 of module retention portion 224 is somewhat less than slope b that characterizes the upper portion of side surfaces 228 of body portion 222, so that a wedge-shaped gap 238 will be created on each side of mounting structure 220 when the module retention portion is connected to the body portion.

Gaps 238 are each configured to receive and securely engage a flexible photovoltaic module 240, which as a practical matter will typically be positioned along arcuate side surfaces 228 before module retention portion 224 is tightened against body portion 222. Furthermore, because the slope of angled surfaces 234 is less than the slope at the top of side surfaces 228, module retention portion 224 will necessarily exert a force on each mounted module 240 which is perpendicular to the module surface. This perpendicular retention force results in relatively secure retention of each module. In an array of photovoltaic modules, several mounting structures 220 will be positioned at a desired separation distance from each other, and flexible modules will be disposed between the mounting structures, and one edge of each module retained by adjacent mounting structures.

Figure 16:
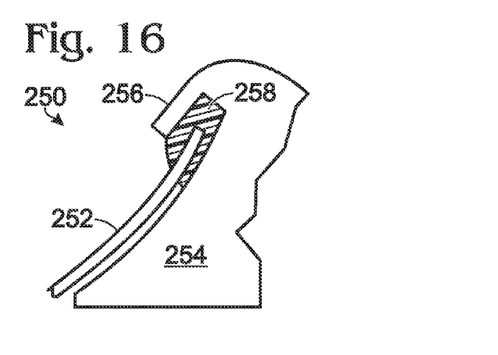
FIG. 16 is a schematic partial elevational view depicting a flexible photovoltaic module mounted to another rooftop with a mounting structure, according to aspects of the present teachings.

FIG. 16 is a partial section view depicting yet another variation of a mounting structure, generally indicated at 250, for a flexible photovoltaic module 252. Mounting structure 250 is depicted as generally similar to mounting structures 100 or 120 shown in FIGS. 9 and 10, i.e., with a body portion 254 and a substantially planar module overlap portion 256, but the teachings of this example can be applied to any of the previously described mounting structures of FIGS. 9-15. Specifically, mounting structure 250 includes a bead of sealant 258 disposed between body portion 254 and overlap portion 256, to engage the edge of module 252 in an additional manner. Furthermore, sealant 258 can reduce the chances of water penetration at the module edge, by sealing the edge. Sealant 258 may, for example, be constructed from silicon, butyl, or any other similar material. In some cases, the sealant may be applied before the module is positioned with its edge retained by the mounting structure, whereas in other cases, the module may be positioned first and the sealant applied afterward.

Figure 17:
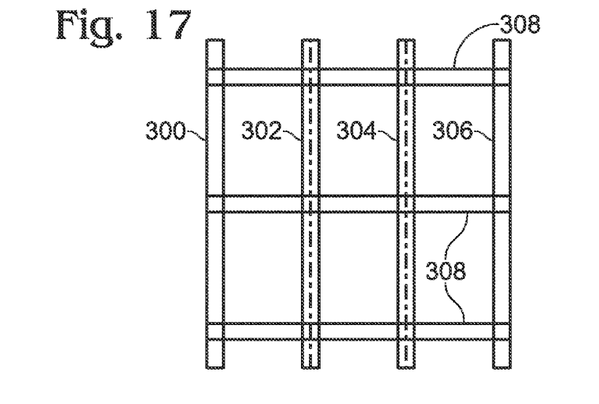
FIG. 17 is a top view schematically depicting a system of mounting structures for mounting flexible photovoltaic modules to a surface, according to aspects of the present teachings.

FIG. 17 is a schematic plan view of an array of flexible photovoltaic module mounting structures 300, 302, 304, 306, mounted upon a plurality of mounting rails 308. Rails 308, in turn, will generally be mounted upon an underlying surface such as a building rooftop, the ground, or a vehicle. Although four mounting structures and three mounting rails are shown in FIG. 17, more generally, any number of mounting structures and mounting rails can be employed to create an array of any desired size. Furthermore, the mounting structures can have any desired lengths, depending on the sizes of the photovoltaic modules to be mounted.

The number of rails will generally depend on the lengths of the mounting structures, with rails disposed at sufficient intervals along the length of each mounting structure to ensure a desired degree of support and engagement of the mounting structures and thus of the mounted photovoltaic modules. In some cases, as described previously, the mounting structures may be mounted directly to a rooftop or other underlying surface, in which case mounting rails may be omitted entirely. In other cases, an additional underlying support structure (not shown) can be provided under the mounting rails, to attach to an underlying surface and provide a predetermined set of mounting points for the mounting rails. This method offers opportunities for full integration in various roofing structures and to minimize penetrations of the roofing membrane or building envelope.

As suggested in FIG. 17, mounting structures at the edge of an array, such as mounting structures 300 and 306, may be unidirectional, i.e. they may be configured to receive and engage just a single photovoltaic module edge from one direction. On the other hand, mounting structures in the middle of the array (or in any positions other than at a lateral edge of the array), such as mounting structures 302 and 304, may be bidirectional, i.e. they may be configured to receive and engage the edges of two different photovoltaic modules disposed on opposite sides of the mounting structure. The bidirectional nature of mounting structures 302 and 304 is indicated by dashed lines representing the respective axes of symmetry of those structures. In some cases mounting rails might be bidirectional but have a different mounting design on either side for best mounting of modules as mentioned above.

The design of rails 308 or the underlying support structure (if one is provided) can be such that the mounting system allows photovoltaic module installation spanning uneven surfaces (such as corrugated metal roofs or ceramic tile roofing as examples) and keeps the modules out of water puddles. In addition, a slope can be integrated into the mounting rails and/or underlying support structure such as to maintain a 3-5 degree slope along the length of the module (e.g., from top to bottom in FIG. 17) for water drainage.

Figure 18:
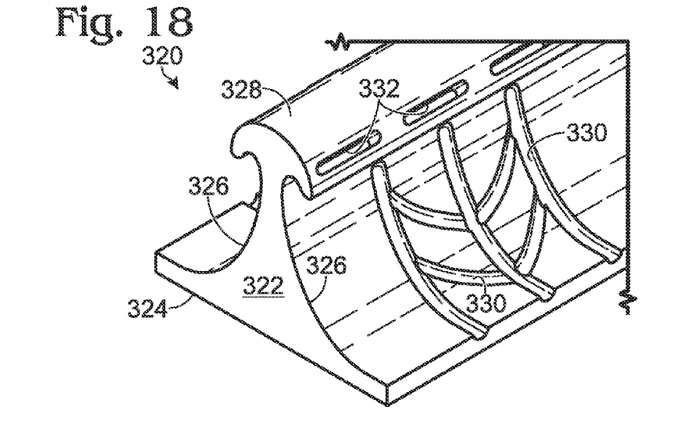
FIG. 18 is an isometric view depicting a portion of a mounting structure for mounting flexible photovoltaic modules to a surface, according to aspects of the present teachings.

FIG. 18 is an isometric view depicting another bidirectional mounting structure, generally indicated at 320, for mounting flexible photovoltaic modules to a surface, according to aspects of the present teachings. Mounting structure 320 includes a solid body portion 322 having a substantially planar bottom surface 324 configured to be mounted to a rooftop, rails, or some other underlying structure, and a pair of arcuate lateral surfaces 326 each configured to support and guide a lateral portion of a photovoltaic module. The mounting structure also includes a bidirectional top module retention portion 328 with two symmetric sides, each side of which is configured to receive and retain the lateral edge of a mounted module, by retaining the edge of the module in a groove or gap formed between one side of the module retention portion and the body portion, as has also been described previously with respect to various other mounting structure examples.

In addition, the body portion of mounting structure 320 includes a plurality of profile features 330 disposed along lateral surfaces 326. Profile features 330, which are depicted in FIG. 9A as recessed grooves, alternatively can take the form of raised relief features. In either case, having profile features that provide regions of varying elevation away from lateral surfaces 326 provides paths for water to flow away from the back surface of a photovoltaic module installed against mounting structure 320, a reduction of capillary forces between the module and any trapped water, and/or improved air circulation that can help to avoid module overheating. The profile features are depicted in FIG. 18 to be disposed in a tree-like pattern, but more generally they can be provided in a cross pattern, as parallel features, or in any other desired configuration, including a mixture of raised and recessed features.

Mounting structure 320 also includes a plurality of apertures 332 disposed along module retention portion 328. These apertures may extend any desired depth into the body of the mounting structure, and are configured to provide ventilation to the mounting structure for the purpose of dissipating heat transferred to the mounting structure by an installed photovoltaic module.

Figure 19:
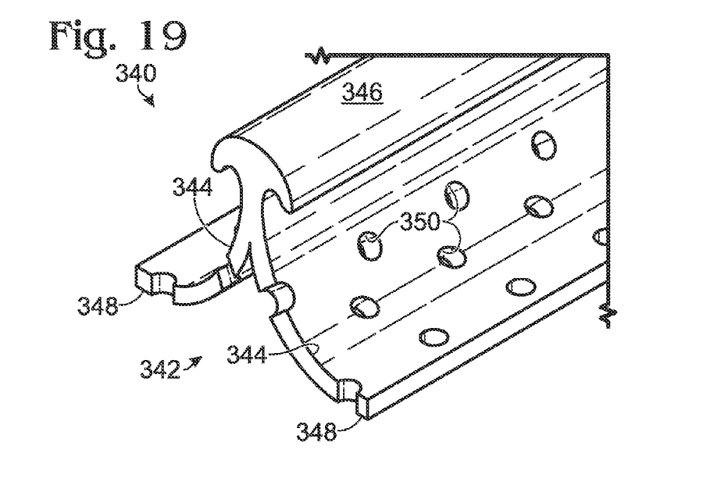
FIG. 19 is an isometric view depicting a portion of another mounting structure for mounting flexible photovoltaic modules to a surface, according to aspects of the present teachings.

FIG. 19 is an isometric view depicting another mounting structure, generally indicated at 340, for mounting flexible photovoltaic modules to a surface, according to aspects of the present teachings. Mounting structure 340 includes some of the same features as mounting structure 320 depicted in FIG. 18, such as a body portion 342 including a pair of arcuate lateral mounting surfaces 344, and a bidirectional top module retention portion 346. However, body portion 342 of mounting structure 340 is not solid, but is rather defined solely by lateral mounting surfaces 344. Distal end portions 348 of the lateral mounting surfaces jointly define a plane, within which mounting structure 340 would contact an underlying surface or underlying rails.

Mounting structure 340 also includes a plurality of apertures 350, arranged in a pattern along lateral mounting surfaces 344 and penetrating entirely through the lateral mounting surfaces. Apertures 350 are configured to allow water to drain from underneath an installed photovoltaic module into the empty space between the lateral mounting surfaces. Depending upon their dimensions, apertures 350 also may provide a measurable degree of cooling ventilation to the underside of an installed module, particularly when combined with air flow through the space under the lateral mounting surfaces, which can create Bernoulli pressure that pulls air and water through the apertures and into the empty space between mounting surfaces 344.

Figure 20:
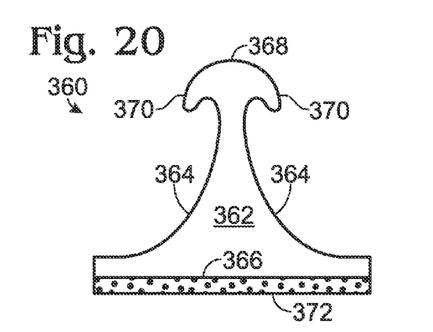
FIG. 20 is an elevational view depicting a mounting structure for mounting flexible photovoltaic modules to a surface, according to aspects of the present teachings.

FIG. 20 is an elevational view of another exemplary bidirectional mounting structure, generally indicated at 360, for mounting flexible photovoltaic modules to a surface, according to aspects of the present teachings. As in previous exemplary embodiments, mounting structure 360 includes a body portion 362 having a pair of curved lateral mounting surfaces 364 and a substantially planar bottom surface 366, and a bidirectional module edge retention portion 368 with a pair of overhanging lips 370. Each overhanging lip 370 forms a groove, configured to receive and retain an edge of a flexible photovoltaic module, between itself and an upper portion of the corresponding mounting surface 364.

In addition, FIG. 20 depicts a layer of adhesive 372, which is configured to facilitate secure mounting of structure 360 upon an underlying surface such as a roofing membrane or a camper/trailer roof. Adhesive layer 372 may, for example, be formed of a material designed to provide a secure and long-lasting adhesive bond with common roofing materials such as thermoplastic polyolefin (TPO). Due to the common use of TPO in rooftop membranes, many such adhesives are known. In one embodiment the bottom of the rail could be made of the same material as the roofing membrane (for example TPO) allowing a heat welding of the rail directly to the roofing membrane prior to mounting the module. For this purpose the TPO attached to the bottom of the rail could also overhang the edges of the rail on one or both sides to allow easier heat welding on the roof site. In such a way the rail is securely connected to the roofing membrane without the need of a roof penetration.

Figure 21:
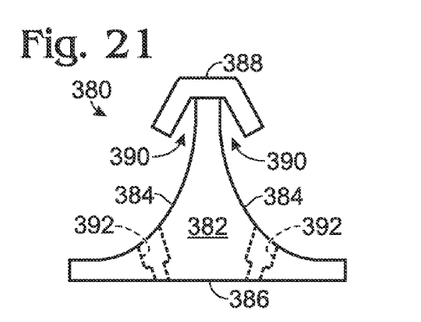
FIG. 21 is an elevational view depicting another mounting structure for mounting flexible photovoltaic modules to a surface, according to aspects of the present teachings.

FIG. 21 is an elevational view of another exemplary bidirectional mounting structure, generally indicated at 380, for mounting flexible photovoltaic modules to a surface, according to aspects of the present teachings. As in previous exemplary embodiments, mounting structure 380 includes a body portion 382 having a pair of curved lateral mounting surfaces 384 and a bottom surface 386 defining a plane, and a bidirectional module edge retention portion 388 forming a pair of retaining grooves 390 with the body portion, each groove configured to receive and retain an edge of a flexible photovoltaic module. In addition, mounting structure 380 includes a pair of stepped apertures 392, each configured to receive a fastener such as a screw for attaching the mounting structure to an underlying rooftop, mounting rail, or other surface.

Figures 22, 23:
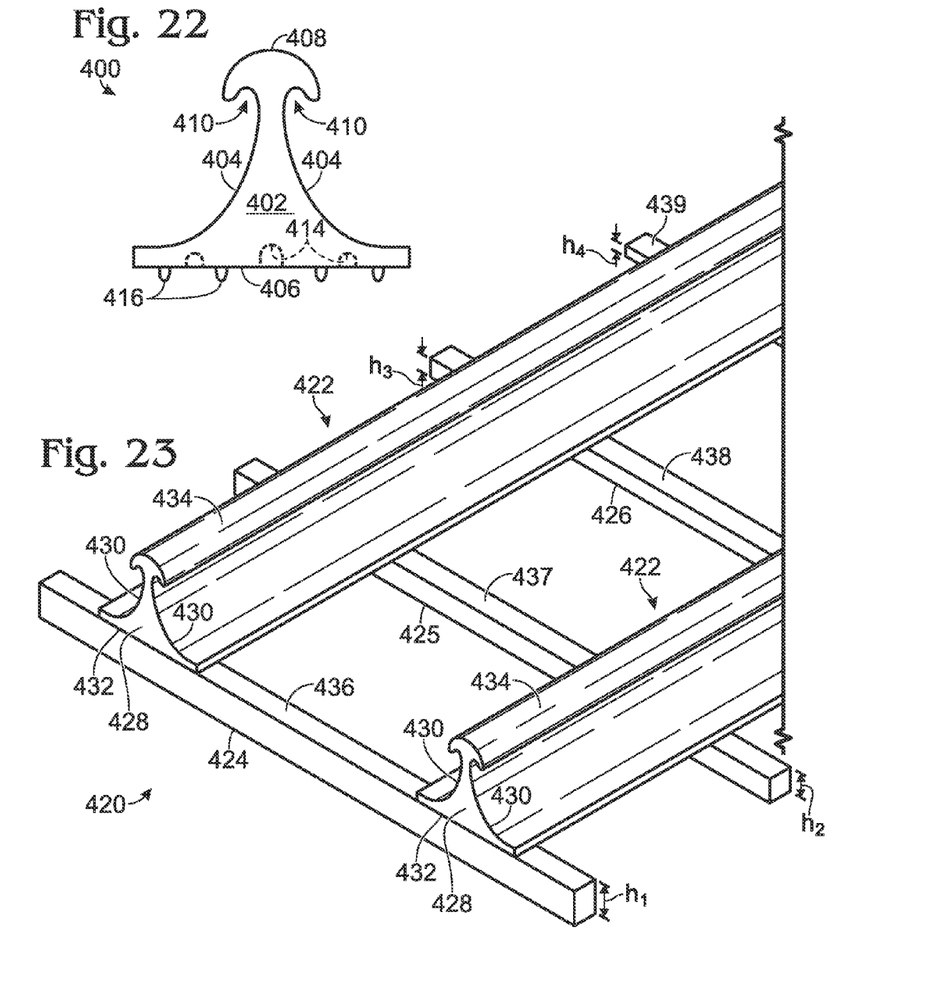
FIG. 22 is an elevational view depicting another mounting structure for mounting flexible photovoltaic modules to a surface, according to aspects of the present teachings.
FIG. 23 is an isometric view depicting portions of an array of mounting structures for mounting flexible photovoltaic modules to a surface, according to aspects of the present teachings.

FIG. 22 is an elevational view of yet another exemplary bidirectional mounting structure, generally indicated at 400, for mounting flexible photovoltaic modules to a surface, according to aspects of the present teachings. As in previous exemplary embodiments, mounting structure 400 includes a body portion 402 having a pair of curved lateral mounting surfaces 404 and a bottom surface 406, and a bidirectional module edge retention portion 408 forming a pair of retaining grooves 410 with the body portion, each groove configured to receive and retain an edge of a flexible photovoltaic module.

Rather than defining a completely planar bottom surface, however, bottom surface 406 of mounting structure 400 includes a plurality of grooves 414 and teeth 416. Grooves 414 can result in improved bonding with an underlying adhesive layer, and teeth 416 (which also may be referred to as claws) can penetrate an underlying surface and thus provide more secure attachment between mounting structure 400 and a relatively soft underlying surface or layer. In the example depicted in FIG. 22, both grooves and teeth are shown. In other cases, only grooves or only teeth may be provided, depending upon the situation. Furthermore, the dimensions and spacing of the grooves and/or teeth can be varied to any desired degree, for instance to optimize the connection between the mounting structure and a particular underlying surface.

FIG. 23 is an isometric view of an array, generally indicated at 420, of bidirectional mounting structures 422 for flexible photovoltaic modules, and underlying mounting rails 424, 425, 426, 427. Although FIG. 23 depicts two mounting structures and two mounting rails, more generally any number of mounting structures and mounting rails can be provided, to create a mounting array (and thus a photovoltaic module array) of any desired dimensions. Furthermore, in some cases mounting structures may be configured to be mounted to existing, commercially available solar panel mounting adapters optimized for certain roof types rather than to rails.

Mounting structures 422 each are generally similar to previously described bidirectional mounting structures, including a body portion 428 having a pair of curved lateral mounting surfaces 430 and a bottom surface 432, and a bidirectional module edge retention portion 434, each side of which is configured to receive and retain a lateral edge of a flexible photovoltaic module. The mounting structures can be attached to the mounting rails by any suitable method, such as by press-fitting protrusions formed on the bottom surface of each mounting structure into complementary apertures formed on the top surface of each mounting rail, with screws, pins, adhesive, and/or the like.

In array 420, rails 424, 425, 426 and 427 each include a top surface respectively indicated at 436, 437, 438 and 439. In addition, rail 424 is characterized by a height $h_1$, rail 425 is characterized by a height $h_2$, rail 426 is characterized by a height $h_3$, and rail 427 is characterized by a height $h_4$. The heights of the different rails may not all be the same, but rather may, for example, decrease monotonically (i.e., $h_4<h_3<h_2<h_1$), resulting in a downward tilt of mounting structures 422 in the direction from rail 424 toward rail 427. Similarly, the rail heights may increase monotonically, in which case any subsequent rails beyond rail 427 would have progressively greater heights, resulting in an upward tilt of mounting structures 422 in the direction from rail 424 toward rail 427. In either case, the tilt reduces the possibility of standing water on any modules mounted on mounting structures 422, and can also increase solar exposure if the modules are angled appropriately.

Figure 24:
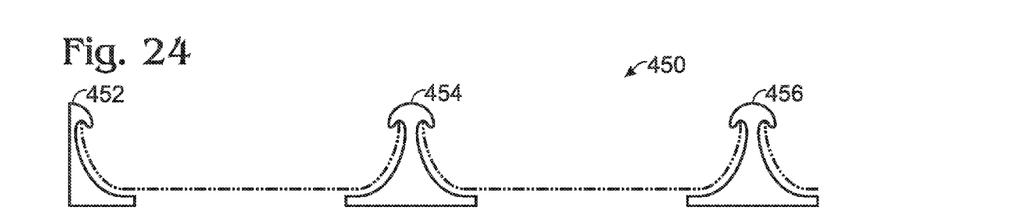
FIG. 24 is a schematic elevational view depicting part of an array of mounting structures for mounting flexible photovoltaic modules to a surface, according to aspects of the present teachings.

FIG. 24 depicts an elevational view of part of an array of mounting structures for flexible photovoltaic modules, generally indicated at 450, illustrating the possibility that mounting structures at the array edges may be unidirectional, whereas mounting structures at other positions may be bidirectional. Specifically, mounting structure 452 is disposed at the left edge of array 450 and accordingly is unidirectional, whereas mounting structures 454, 456 are disposed within array 450 but not at either lateral edge, and accordingly are each bidirectional. Array 450 continues to the right of mounting structure 456, eventually terminating with another unidirectional mounting structure (not shown) disposed at the right edge of the array.

Figure 25:
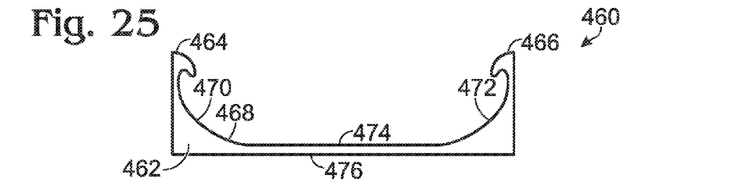
FIG. 25 is a schematic elevational view depicting a mounting structure for mounting flexible photovoltaic modules to a surface, according to aspects of the present teachings.

FIG. 25 depicts an elevational view of another flexible photovoltaic module mounting structure, generally indicated at 460, which is continuously formed. More specifically, mounting structure 460 includes a central body portion 462, a left-hand module retaining portion 464, and a right-hand module retaining portion 466, all continuously formed, for example in a molding or casting process. Central body portion 462 includes a top surface 468 having two arcuate lateral sections 470, 472, a substantially flat middle section 474, and a substantially flat bottom surface 476. Accordingly, a photovoltaic module mounted upon mounting structure 460 will be curved only near its lateral edges, while its central region will remain substantially flat. This may be desirable, for example, to maintain a constant angle of a large portion of the module, which can result in greater solar exposure.

Figure 26:
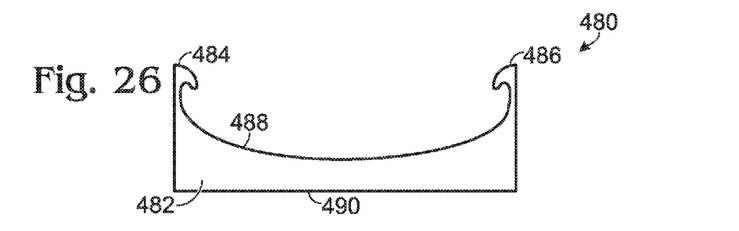
FIG. 26 is a schematic elevational view depicting another mounting structure for mounting flexible photovoltaic modules to a surface, according to aspects of the present teachings.

FIG. 26 depicts an elevational view of yet another flexible photovoltaic module mounting structure, generally indicated at 480, which is continuously formed. Like mounting structure 460 depicted in FIG. 11B, mounting structure 480 includes a central body portion 482, a left-hand module retaining portion 484, and a right-hand module retaining portion 486, all continuously formed, for example in a molding or casting process. Central body portion 482 includes a top surface 488 which is arcuate along its entire width between the module retaining portions, and a substantially flat bottom surface 490. Accordingly, a photovoltaic module mounted upon mounting structure 480 will be curved along its entire width. This may be desirable, for example, to reduce standing water on the surface of the module and/or to increase solar absorption of low-angle rays through reflection toward another portion of the module.

Figure 27:
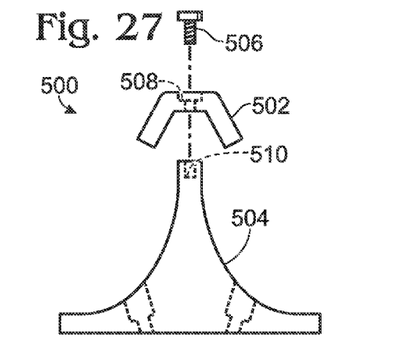
FIG. 27 is a schematic elevational view depicting another mounting structure for mounting flexible photovoltaic modules to a surface, according to aspects of the present teachings.

FIG. 27 depicts an elevational view of still another bidirectional mounting structure, generally indicated at 500, for mounting flexible photovoltaic modules. This example illustrates a two-piece design for a bi-directional mounting structure, in which a module retaining portion 502 can be attached to a body portion 504 with a fastener such as a screw 506, which passes through complementary apertures 508, 510 in the retaining portion and the body portion, respectively. When retaining portion 502 is joined to body portion 504, grooves are formed between each side of the retaining portion and the body portion, within which a lateral edge of a photovoltaic module can be received and retained, as has been described previously.

Figure 28:
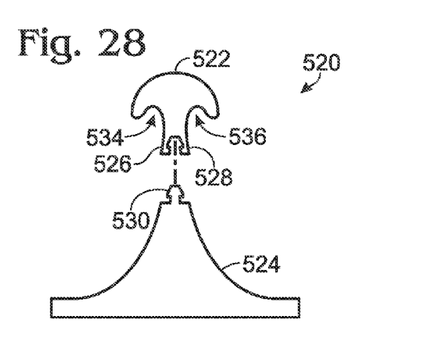
FIG. 28 is a schematic elevational view depicting another mounting structure for mounting flexible photovoltaic modules to a surface, according to aspects of the present teachings.

FIG. 28 depicts an elevational view of yet another bidirectional mounting structure, generally indicated at 520, for mounting flexible photovoltaic modules. This example also illustrates a two-piece design for a bi-directional mounting structure, in which a module retaining portion 522 can be attached to a body portion 524. In this case, the module retaining portion includes a pair of resilient attachment members 526, 528, which are configured to widen sufficiently to pass over a complementary attachment member 530 of the body portion, and then to snap back into position to secure the module retaining portion to the body portion. Module retaining grooves 534, 536 formed in the module retaining portion are then each configured to receive and retain a lateral edge of a photovoltaic module in a manner already described above.

Figure 29:
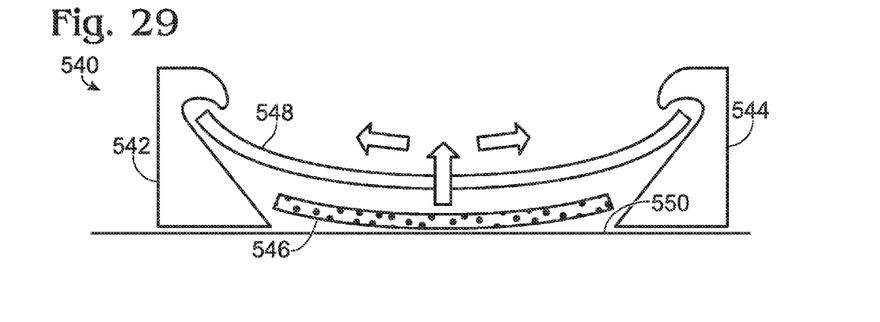
FIG. 29 is a schematic elevational view depicting mounting structures for mounting flexible photovoltaic modules to a surface, according to aspects of the present teachings.

FIG. 29 is a schematic exploded elevational view depicting another alternate mounting assembly, generally indicated at 540, for mounting flexible photovoltaic modules to a surface, according to aspects of the present teachings. Mounting assembly 540 includes a pair of module mounting structures 542, 544, which are depicted as generally similar to the mounting structures shown in FIG. 24 but which could be, for example, similar to any of the module mounting structures described previously in this disclosure. For instance, module mounting structures 542, 544 each could be any suitable unidirectional or bidirectional mounting structure, such as those illustrated in FIGS. 9-28 and described above.

In addition, mounting assembly 540 includes an underlying resilient foam portion 546, which is configured to be disposed between a mounted flexible module 548 and an underlying surface 550 such as a rooftop. The underlying foam has the function to provide a spring-loaded force for the module to be pushed upward and into the mounting brackets (i.e., the module retention portions), as indicated by the arrows in FIG. 29. The foam would be compressed in the center during installation, and once the module edges are in the mounting brackets it would be allowed to expand, pushing the module up. The foam could take the form of expandable spray foam or a foam mat. It could be attached either to the rooftop or the back of the module. It would typically run the length of the module, but it could be rather narrow (or wide) across the width of the module.

Figure 30:
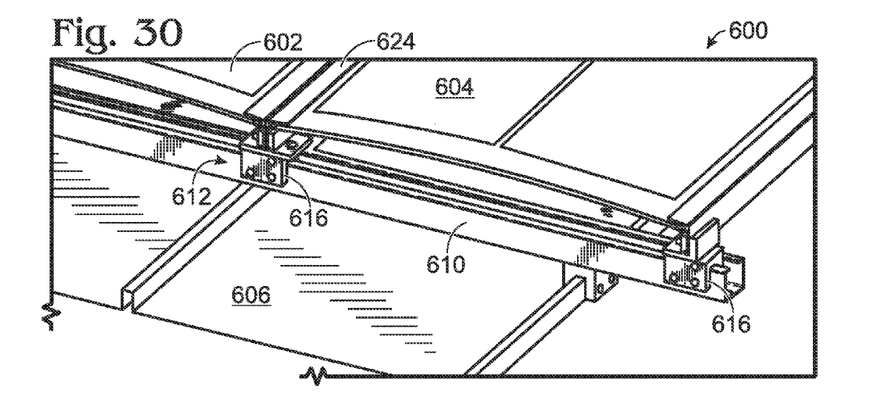
FIG. 30 is an isometric view depicting a portion of an array of flexible photovoltaic modules mounted to a surface, according to aspects of the present teachings.
Figure 31:
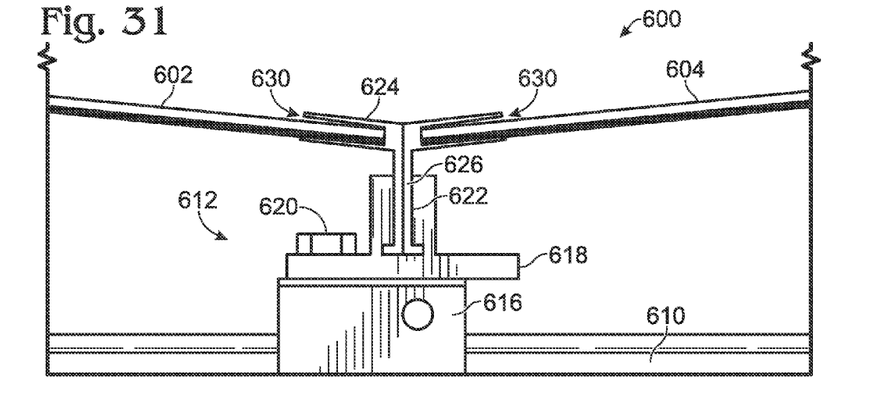
FIG. 31 is a magnified elevational view showing more details of a portion of the array shown in FIG. 30.
Figure 32:
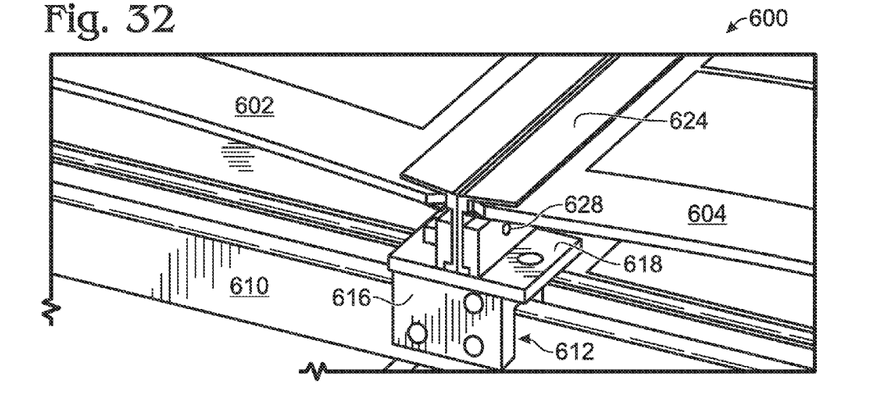
FIG. 32 is a magnified isometric view showing more details of a portion of the array shown in FIG. 30.

FIGS. 30-32 depict a photovoltaic array, generally indicated at 600, in which a pair of flexible photovoltaic modules 602, 604 has been mounted to a surface using a mounting system according to aspects of the present teachings. More specifically, a support structure 606 is shown supporting a mounting rail 610. This support structure is merely exemplary, and may be replaced with any suitable framework that can support mounting rails. In some cases, mounting rails can be attached directly to a rooftop, in which case support structure 606 can be omitted entirely. Mounting rail 610 supports a plurality of mounting structures, generally indicated at 612, for flexible photovoltaic modules 602, 604. Additional mounting rails, not shown, would generally be provided to support the modules along any desired module or array length.

FIG. 30 is an isometric view illustrating a portion of array 600, and FIG. 31 is a front elevational view showing more details of mounting structures 612. FIG. 32 is a magnified isometric view of a portion of the array. As these drawings depict, mounting rail 610 includes receiving brackets 616 that can be selectively positioned at any desired position on the mounting rail and then fixed into place, and mounting structures 612 include a lower mounting component 618 configured to be securely attached to one of receiving brackets 616 of the rails with bolts 620 that pass through complementary apertures in each lower mounting bracket and lower mounting component. Lower mounting components 618 generally do not span the length of the cell or array, but rather are configured just to provide discrete interface points between rails 610 and cells 602, 604, as described in more detail below.

Each lower mounting component includes a T-shaped groove 622, into which a complementary upper mounting component 624 having a T-shaped lower portion 626 can be positioned, for example by sliding. An aperture 628 is provided in the side of each lower mounting component so that the upper mounting component can be secured to the lower mounting component, for example with a fixing screw (not shown). As can best be seen in FIGS. 30 and 32, the upper mounting component may be configured to span the length of a cell or a multi-cell array.

Upper mounting components disposed at positions other than a lateral edge of an array, such as upper mounting component 624, are bidirectional, and define a pair of module retaining grooves 630, each configured to receive a lateral edge portion of one of modules 602, 604 from opposite directions. On the other hand, upper mounting component disposed at a lateral edge of an array, such as mounting component 624', can be unidirectional, defining just a single module retaining groove 630 configured to receive the edge of one module from the direction toward the interior of the array. In any case, retaining grooves 630 may be angled slightly upward relative to an underlying mounting surface, to match or approximately match the intended curvature of the modules. This curvature will generally be created by positioning adjacent receiving brackets 616 at separation distances slightly less than the width of one of modules 602, 604, so that the module will necessarily be curved when its edges are inserted into the appropriate retaining grooves 630.

Figure 33:
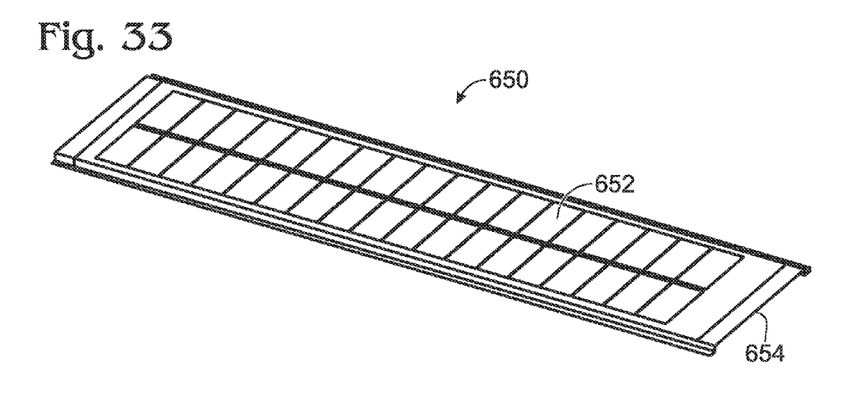
FIG. 33 is an isometric view depicting a flexible photovoltaic module mounted to yet another mounting structure for mounting flexible photovoltaic modules to a surface, according to aspects of the present teachings.
Figure 34:
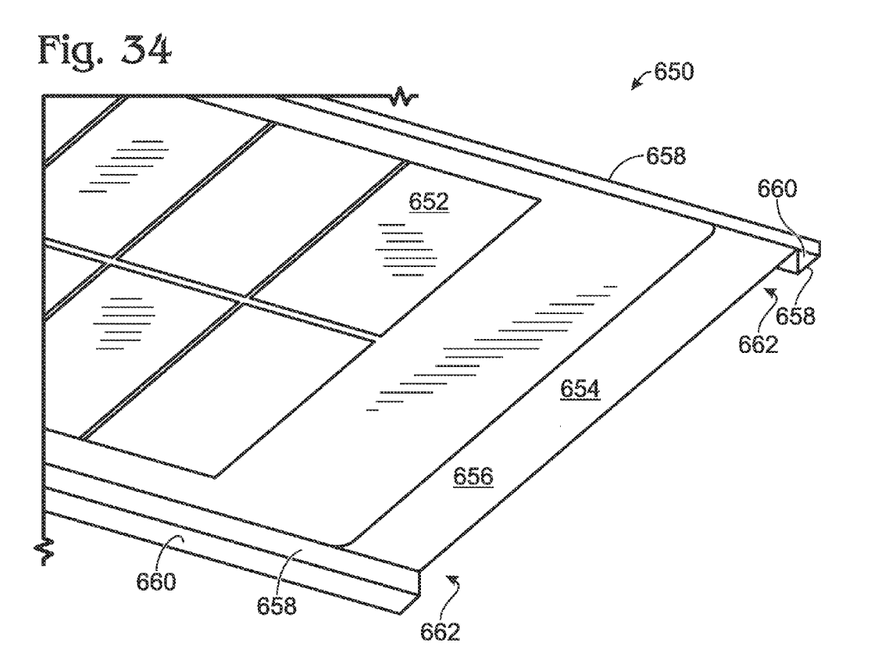
FIG. 34 is a magnified isometric view showing more details of a portion of the module and mounting structure shown in FIG. 33.

FIGS. 33-34 depict a photovoltaic module 652 mounted to yet another alternate mounting structure, generally indicated at 650, according to aspects of the present teachings. Mounting structure 650 includes a thin sheet of metal 654, such as a sheet of Galvalume®, which is formed from steel coil coated with a zinc-aluminum alloy. Sheet 654 includes a central module support region 656 and raised edges 658 each having a mounting lip 660. The raised edges give the sheet strength and allow mounting with a gap 662 under the module to lift the module off of a rooftop. This is beneficial because it lifts the module out of standing water.

Alternatively, mounting structure 650 can be mounted on any other surface that isn't flat or suited for flat module mounting (corrugated metal roof, ceramic roofing times, etc). The mounting structure can be screwed onto the roof or a supporting structure by screwing through mounting lips 660, or clamped using those lips. In some cases, the backsheet of module 652 (which is integral to the hermetic seal of the module and contains a metallic foil) can be replaced with sheet 654 for simplicity and cost savings. This requires the cell assembly to be sufficiently electrically isolated from the metal sheet functioning as the module backsheet, as this backsheet is now exposed and grounded via the mounting hardware.

According to the present teachings, the design of a mounting structure for a flexible photovoltaic module can be such that the forces of the module are distributed along the entire edge of the module, or alternatively grab the top and bottom surface of the module outside its active PV area. The mounting structure may further have a ventilation system integrated to allow any water to drain away from the module and specifically from the module edge. It should also allow airflow around the module edges to ensure drying of any wet area.

Alternatively or in addition, mounting structures according to the present teachings could have a surface relief in the regions where it is in contact with the module to counteract capillary forces that might trap water. In an alternate mounting, a bead of silicone or other sealant or adhesive could protect the module edge from water and secure the module in a groove or on top of the mounting structure. If modules are clamped, it is conceivable that an exchange of modules or a replacement of the roof underneath is done without damaging the modules.

Each mounting structure described in this disclosure can be mounted directly on a surface or interface with specific mounting hardware already developed and commercially available for specific roofing types or other constructions. The structures holding the modules and a number of cross members can form a stiff frame that would hold a single or multiple modules. Such a frame could, for example, be 6 meters long and 6 meters wide, holding 12 modules. Such a frame could then be mounted onto a flexible understructure such as a landfill cover. This frame would float on top of the flexible ground, but keep the modules free of any forces. In such a design, individual modules could be removed and replaced individually without damage to the module or the neighboring modules. In addition, such a frame could be sized to a single power inverter providing an independent string of modules.

What is claimed is:

1. A photovoltaic assembly, comprising:
   first and second photovoltaic mounting structures, each including a module retention portion and a body portion having a bottom surface configured to be attached to an underlying structure;
   the module retention portion of the first mounting structure including a module overlap portion extending from the body portion of the first mounting structure to define a uniformly narrowing gap between the overlap portion and the body portion, terminating in a distal pinch point configured to receive an edge portion of a photovoltaic module; and
   a flexible photovoltaic module disposed between the mounting structures with a first edge of the module positioned within the module retention portion of the first mounting structure and a second edge of the module positioned within the module retention portion of the second mounting structure, such that the first edge of the module is received in the uniformly narrowing gap with the first edge pinched between the overlap portion and the body portion, thereby fixing the position of the first edge of the module as it reaches the distal pinch point;
   wherein the first and second mounting structures are disposed a distance apart less than a width of the module, thereby causing the module to curve in a state of compression between the mounting structures while leaving a center portion of the module free standing.

2. The assembly of claim 1, wherein the mounting structures are two-part structures with the module retention portion selectively attachable and removable from the body portion.

3. The assembly of claim 1, wherein the mounting structures are bidirectional and symmetric about a central axis.

4. The photovoltaic assembly of claim 1, wherein the module is disposed between the mounting structures with positive curvature, so that the center of the module is higher than the edges of the module.

5. The photovoltaic assembly of claim 1, wherein the module is disposed between the mounting structures with negative curvature, so that the center of the module is lower than the edges of the module.

6. The photovoltaic assembly of claim 1, wherein the first mounting structure is configured to receive an entire length of the module.

7. The photovoltaic assembly of claim 1, wherein the module retention portion of the second mounting structure is substantially a mirror image of the module retention portion of the first mounting structure.

* * * * *